United States Patent
Czigler et al.

(10) Patent No.: US 12,111,370 B2
(45) Date of Patent: Oct. 8, 2024

(54) SYSTEM AND METHOD FOR ACTIVE MONITORING AND MITIGATION OF THERMAL EVENTS ON MAGNETIC RESONANCE COILS

(71) Applicant: GE Precision Healthcare LLC, Wauwatosa, WI (US)

(72) Inventors: Michael Joseph Czigler, Cleveland, OH (US); Taylan Dalveren, North Ridgeville, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 106 days.

(21) Appl. No.: 17/994,620

(22) Filed: Nov. 28, 2022

(65) Prior Publication Data

US 2024/0175950 A1  May 30, 2024

(51) Int. Cl.
*G01V 3/00* (2006.01)
*G01R 33/34* (2006.01)

(52) U.S. Cl.
CPC ................ *G01R 33/34015* (2013.01)

(58) Field of Classification Search
CPC ............ G01R 33/3415; G01R 33/543; G01R 33/5659; G01R 33/36; A61B 5/055
USPC ........................................................ 324/307
See application file for complete search history.

(56) References Cited

U.S. PATENT DOCUMENTS

| | | | | |
|---|---|---|---|---|
| 7,276,935 B1 * | 10/2007 | Camarota | ........ | H03K 19/17788 326/38 |
| 2010/0188083 A1 * | 7/2010 | Cao | ...................... | G01R 33/389 324/318 |
| 2011/0037471 A1 * | 2/2011 | Nozaki | .............. | G01R 33/3685 324/322 |
| 2017/0238902 A1 * | 8/2017 | Lee | ...................... | A61B 8/4455 |

FOREIGN PATENT DOCUMENTS

| | | | | |
|---|---|---|---|---|
| CA | 2815242 A1 * | 5/2012 | ........... | H01F 7/1805 |
| CN | 103443642 A * | 12/2013 | ....... | G01R 33/34023 |
| CN | 111983526 A * | 11/2020 | ........... | G01R 33/032 |
| WO | 2015115141 | 8/2015 | | |
| WO | WO-2019103988 A1 * | 5/2019 | ....... | G01R 33/34007 |

* cited by examiner

*Primary Examiner* — Walter L Lindsay, Jr.
*Assistant Examiner* — Frederick Wenderoth
(74) *Attorney, Agent, or Firm* — Fletcher Yoder P.C.

(57) ABSTRACT

A radio frequency (RF) receiving coil assembly for a magnetic resonance imaging (MRI) system includes a plurality of loops. The RF receiving coil assembly also includes a plurality of electronics units, wherein a respective electronics unit of the plurality of electronics units is coupled to a respective loop of the plurality of loops, wherein each respective electronics unit includes circuitry configured to measure a temperature of the respective loop and to regulate power provided to the respective loop based on the temperature of the respective loop.

20 Claims, 6 Drawing Sheets

SYSTEM AND METHOD FOR ACTIVE MONITORING AND MITIGATION OF THERMAL EVENTS ON MAGNETIC RESONANCE COILS

BACKGROUND

The subject matter disclosed herein relates to medical imaging and, more particularly, to a system and method for active monitoring and mitigation of thermal events on magnetic resonance (MR) coils.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging (MRI), when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

In MRI, surface coils (e.g., radio frequency (RF) receiving coil) are placed proximal (e.g., against) to the patient so as to receive the weak RF signals (weak relative to the transmitted pulses generated by the scanner coils) that are generated by certain gyromagnetic nuclei within the patient as they return to their relaxed state. Safety devices in the surface coil heat up during operation. The surface coil includes safety devices to keep the patient contact point regulated to less than 41 degrees Celsius per international standards for safety of medical electrical equipment. The surface coil includes mitigation measures to ensure the surface coil meets this requirement in a worst-case condition when these surface coil is evaluated during design and development. Even though, the design failure modes are analyzed and mitigation measures are put in place to ensure the surface coil and user safety, there is still the possibility of error.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a radio frequency (RF) receiving coil assembly for a magnetic resonance imaging (MRI) system is provided. The RF receiving coil assembly includes a plurality of loops. The RF receiving coil assembly also includes a plurality of electronics units, wherein a respective electronics unit of the plurality of electronics units is coupled to a respective loop of the plurality of loops, wherein each respective electronics unit includes circuitry configured to measure a temperature of the respective loop and to regulate power provided to the respective loop based on the temperature of the respective loop.

In another embodiment, a system for regulating operation of a magnetic resonance imaging (MRI) system is provided. The system includes a memory encoding processor-executable routines. The system also includes a processor configured to access the memory and to execute the processor-executable routines, wherein the routines, when executed by the processor, cause the processor to perform actions. The actions include monitoring, during a scan by the MRI system, a radio frequency (RF) receiving coil assembly of the MRI system for a signal indicative of at least one loop of a plurality of loops of the RF coil assembly exceeding a threshold temperature, wherein each respective loop of the plurality of loops includes circuitry configured to measure a temperature of the respective loop and to regulate power provided to the respective loop based on the temperature of the respective loop. The actions also include altering the scan of the MRI system upon receiving the signal indicative of the at least one loop exceeding the threshold temperature.

In a further embodiment, a magnetic resonance imaging (MRI) system is provided. The MRI system includes an imaging portion having a radio frequency (RF) receiving coil, wherein the RF receiving coil includes a plurality of loops, wherein each respective loop of the plurality of loops includes circuitry configured to measure a temperature of the respective loop and to deactivate the respective loop when the temperature of the respective loop exceeds a threshold temperature. The MRI system also includes a controller configured to monitor, during a scan by the MRI system, the RF receiving coil assembly of the MRI system for a signal indicative of at least one loop of the plurality of loops exceeding the threshold temperature and to cease the scan or to alter the scan to a lower quality scan upon receiving the signal indicative of the at least one loop exceeding the threshold temperature.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
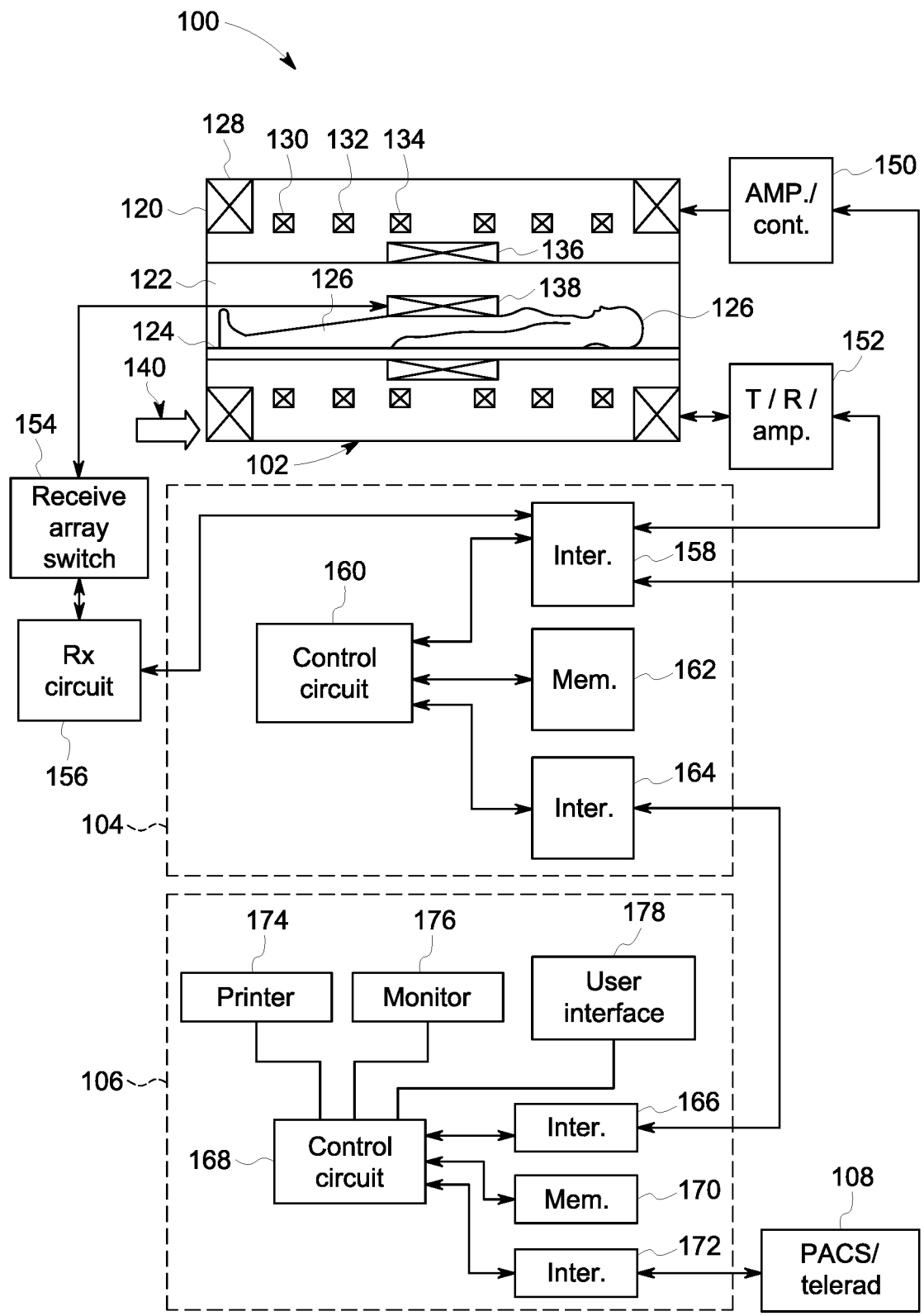
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The present disclosure provides systems and methods for active monitoring and mitigation of thermal events on MR surface coils (e.g., RF receiving coils). In particular, an RF receiving coil assembly of the MRI system includes a plurality of loops and a plurality of electronic units. A respective electronics unit is coupled to a respective loop. Each respective electronics unit includes circuitry configured to measure a temperature of the respective loop and to regulate power (e.g., direct current supplies such as multi-coil bias or preamplifier power) provided to the respective loop based on the temperature of the respective loop. The circuitry is also configured to deactivate the respective loop when the temperature of the respective loop exceeds a threshold temperature (e.g., 41 degrees Celsius, 48 degrees Celsius, or another temperature threshold). Deactivation of the loop may include turning the loop off, passively decoupling the loop, and/or a hybrid combination thereof. The circuitry is further configured to provide a signal indicative of the temperature at least one respective loop exceeding the threshold temperature to a controller of the MRI system.

The circuitry includes a non-magnetic platinum temperature sensor (PTS) configured to measure an electrical resistance of the respective loop, where the electrical resistance corresponds to the temperature of the respective loop. The circuitry also includes determination circuitry coupled to the non-magnetic platinum temperature sensor. The determination circuitry is configured to receive a voltage signal representative of the electrical resistance of the respective loop from the non-magnetic platinum temperature sensor, to compare the voltage signal to a threshold voltage value representative of a threshold temperature, and to deactivate the respective loop when the voltage signal exceeds the threshold voltage value. In certain embodiments, the determination circuitry includes an inverting Schmitt trigger circuit. In certain embodiments, the inverting Schmitt trigger circuit is configured to reactivate the respective loop when the voltage signal is equal to or less than the threshold value. In certain embodiments, the determination circuitry includes an electronic switching circuit having an electromechanical relay coupled to a transistor.

The controller of the MRI system is configured to monitor, during a scan by the MRI system, the RF coil assembly for a signal indicative of at least one loop of the RF coil assembly exceeding a threshold temperature. The controller of the MRI system is also configured to alter the scan of the MRI system upon receiving the signal indicative of at least one loop of the RF coil assembly exceeding the threshold temperature. In certain embodiments, altering the scan of the MRI system includes ceasing the scan (i.e., implementing a fail-safe condition) and stopping the RF coil assembly. In certain embodiments, altering the scan of the MRI system includes derating the scan (i.e., altering the scan to a lower quality scan).

Primary mitigation for heat events for surface MR coils includes coil design (e.g., material choice and testing to make sure the materials are within the limits of international standards for medical electrical equipment), proper labeling, and training of personnel that utilize the surface MR coils. The disclosed embodiments provide secondary mitigation or additional mitigation for these heat events. In particular, the disclosed embodiments allow the RF coil assembly to safely isolate itself during operation by shutting down the coil operation if the heat sensors detect high temperatures at the heat circuits.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data. In certain embodiments, image reconstruction may occur on a separate computing device having processing circuitry and memory circuitry. In certain embodiments, the memory circuit 170 (and/or memory circuitry 162) may store processor-executable code for performing the acts of monitoring, during a scan by the MRI system 100, the RF coil 136 for a signal indicative of at least one loop of the RF coil 136 exceeding a threshold temperature. The acts may also include altering the scan of the MRI system 100 upon receiving the signal indicative of at least one loop of the RF coil 136 exceeding the threshold temperature. In certain embodiments, the act of altering the scan of the MRI system 100 includes ceasing the scan (i.e., implementing a fail-safe condition) and stopping the RF coil 136. In certain embodiments, the act of altering the scan of the MRI system 100 includes derating the scan (i.e., altering the scan to a lower quality scan).

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
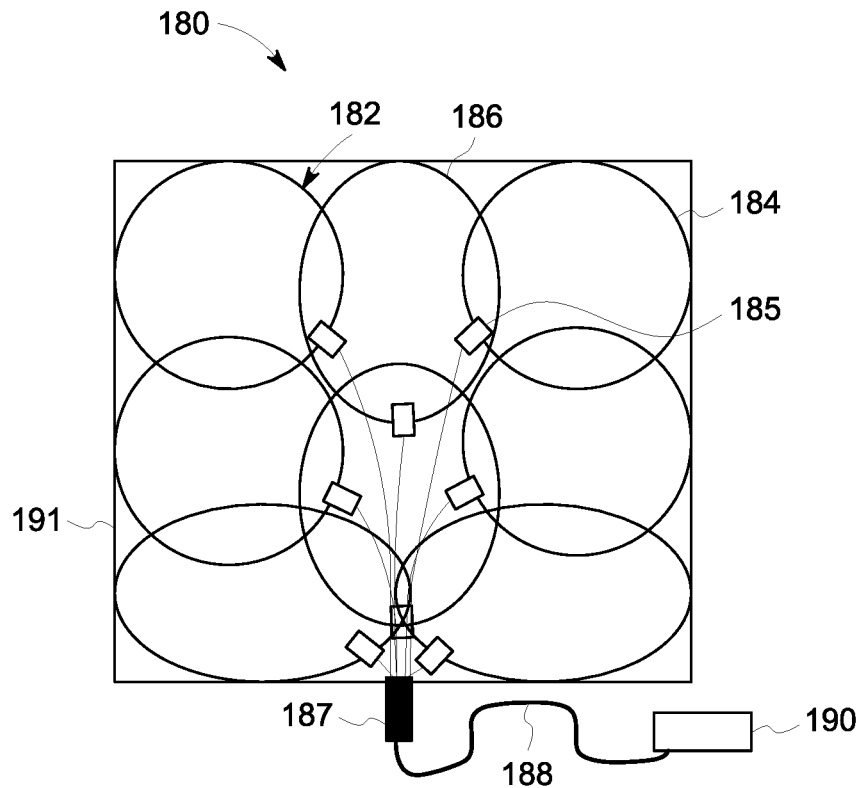
FIG. 2 is a schematic diagram of an RF coil array and is topology, in accordance with aspects of the present disclosure.

FIG. 2 is a schematic diagram of an RF coil array 180 (e.g., RF receiving coil array) and its topology. The RF coil array 180 may be utilized in an MRI system (e.g., MRI system 100 in FIG. 1). The RF coil array 180 includes an RF coil 182 having a plurality of loops 184 (e.g., elements or channels) with each loop 184.

As depicted in FIG. 2, the plurality of loops 184 includes 8 loops (although the number of loops 184 may vary). Each loop 184 is coupled to an electronics unit 185 coupled to a coil-interfacing cable 186. The coil-interfacing cables 186 of each of the loops 184 is coupled to a balun 187 (e.g., integrated balun cable harness). Each electronics unit 185 may include various components (e.g., a decoupling circuit, an impedance inverter circuit, and a pre-amplifier). The balun 187 may act as an RF trap. The balun 187 is coupled (via a cable 188) to a P connector 190 (e.g., port connector) that enables the RF coil array 180 to be coupled to the interface of the MRI system that couples imaging components to processing components.

As described in greater detail below, the electronics unit 185 also includes circuitry configured to measure a temperature of the respective loop 184 and to regulate power (e.g., direct current supplies such as multi-coil bias or preamplifier power) provided to the respective loop 184 based on the temperature of the respective loop 184. The circuitry is also configured to deactivate the respective loop 184 when the temperature of the respective loop 184 exceeds a threshold temperature (e.g., 41 degrees Celsius, 48 degrees Celsius, or another temperature threshold). Deactivation of the loop 184 may include turning the loop 184 off, passively decoupling the loop 184, and/or a hybrid combination thereof. The circuitry is further configured to provide a signal indicative of the temperature of at least one respective loop 184 exceeding the threshold temperature to a controller of the MRI system (e.g., control and analysis circuit 160 and/or control and analysis circuit 168).

The circuitry includes a non-magnetic platinum temperature sensor (PTS) configured to measure an electrical resistance of the respective loop 184, where the electrical resistance corresponds to the temperature of the respective loop 184. The circuitry also includes determination circuitry coupled to the non-magnetic platinum temperature sensor. The determination circuitry is configured to receive a voltage signal representative of the electrical resistance of the respective loop 184 from the non-magnetic platinum temperature sensor, to compare the voltage signal to a threshold voltage value representative of a threshold temperature, and to deactivate the respective loop 184 when the voltage signal exceeds the threshold voltage value. In certain embodiments, the determination circuitry includes an inverting Schmitt trigger circuit. In certain embodiments, the inverting Schmitt trigger circuit is configured to reactivate the respective loop 184 when the voltage signal is equal to or less than the threshold value. In certain embodiments, the determination circuitry includes an electronic switching circuit having an electromechanical relay coupled to a transistor. In certain embodiments, a signal is provided (via the balun 187 coupled to the P connector) to the interface of the MRI system indicating that the RF coil array includes at least one loop 184 where the temperature of the loop 184 exceeds a threshold temperature (e.g., 41 degrees Celsius, 48 degrees Celsius, or another threshold). In certain embodiments, the signal may indicate a failure of the multi-coil bias voltage.

The loops 184 are disposed within an enclosure 191. In certain embodiments, the enclosure may be flexible. As depicted in FIG. 2, each loop 184 partially overlaps with at least one adjacent loop 184. In certain embodiments, the RF coil 182 may be designed utilizing AIR™ coil technology from General Electric Healthcare. This enables the RF coil 182 to be lightweight and flexible.

Figure 3:
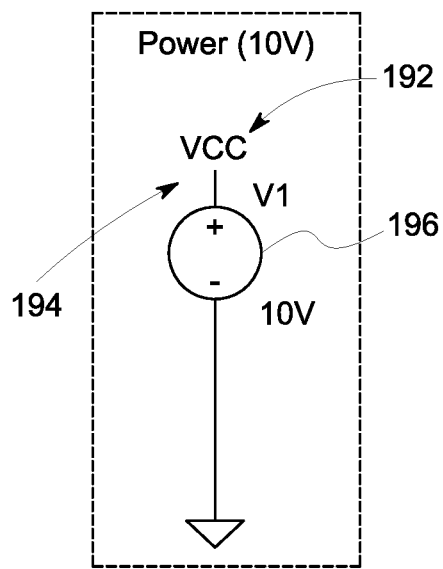
FIG. 3 is a schematic diagram of power circuitry for an RF coil array, in accordance with aspects of the present disclosure.
Figure 4:
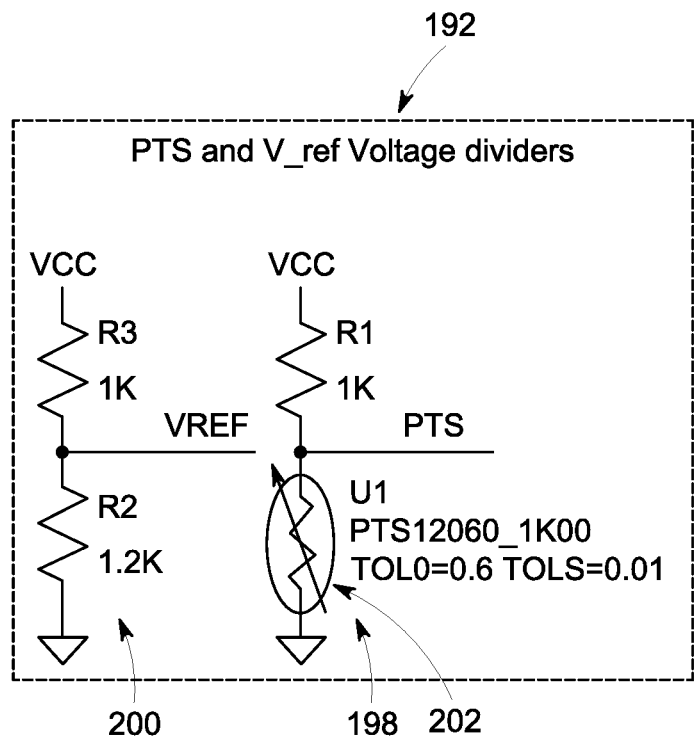
FIG. 4 is a schematic diagram of circuitry of voltage dividers for a non-magnetic platinum temperature sensor and reference voltage, in accordance with aspects of the present disclosure.
Figure 5:
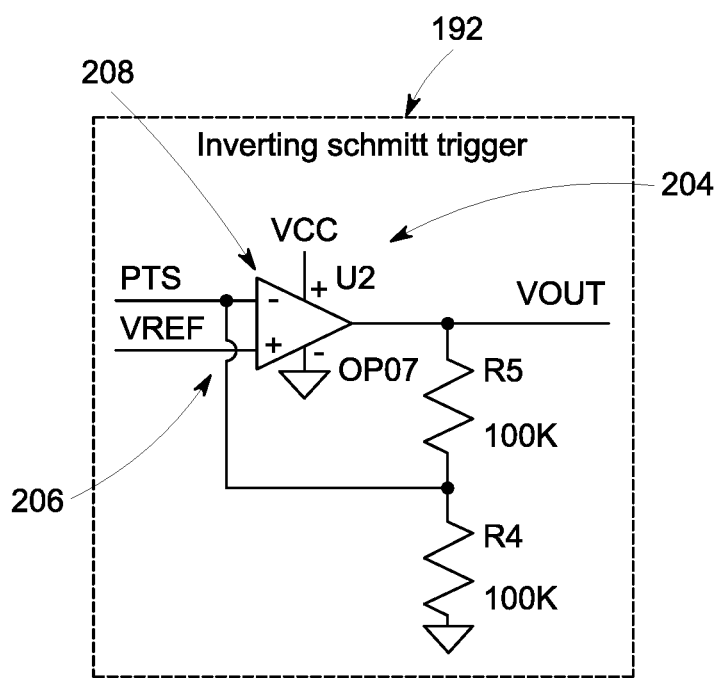
FIG. 5 is a schematic diagram of an inverting Schmitt trigger circuit, in accordance with aspects of the present disclosure.

FIGS. 3-5 are schematic diagrams of circuitry 192 (e.g., obtained from circuit simulation software) utilized to measure a temperature of a loop of an RF receiving coil and to regulate power provided to the respective loop based on the temperature of the respective loop.

FIG. 3 is a schematic diagram of power circuitry 194 for an RF coil array. As depicted, the power circuitry 194 has a power voltage source 196 that provides a voltage (e.g., 10 volts (V)) to power the RF receiving coil.

FIG. 4 is a schematic diagram of circuitry of voltage dividers 198, 200 (e.g., passive linear circuits) for a non-magnetic platinum temperature sensor and reference voltage. The voltage divider 198 includes the non-magnetic platinum temperature sensor 202. The non-magnet platinum temperature sensor 202 is configured to be MRI compatible. The non-magnet platinum temperature sensor 202 is a resistance temperature detector. In particular, the non-magnet platinum temperature sensor 202 is measuring an electrical resistance of a respective loop of the RF receiving coil. The electrical resistance of the respective loop corresponds to the temperature of the respective loop. The non-magnet platinum temperature sensor 202 may be a pure platinum wire coil encapsulated in ceramic or glass, or a thin film of platinum deposited on a ceramic substrate. The voltage divider 200 outputs a voltage signal (PTS) that is representative of the electrical resistance of the respective loop of the RF receiving coil.

The voltage divider 200 outputs a voltage signal (VREF) that serves as a reference voltage (e.g., threshold voltage) as determined by the electrical resistance of the resistors (e.g., R2 and R3). The value of the threshold voltage may correspond to a threshold temperature set at 41 degrees Celsius, 48 degrees Celsius, or another temperature threshold.

FIG. 5 is a schematic diagram of an inverting Schmitt trigger circuit 204. The inverting Schmitt trigger circuit 204 forms part of determination circuitry 206 that is coupled to the non-magnetic platinum temperature sensor (non-magnetic platinum temperature sensor 202 in FIG. 4). The determination circuitry 206 is configured to receive a voltage signal (PTS) representative of the electrical resistance (and the temperature) of the respective loop from the non-magnetic platinum temperature sensor. In certain embodiments, determination circuitry 206 is configured to also receive a voltage signal (VREF) representative of the threshold voltage (and the threshold temperature). The determination circuitry 206 is configured to compare the voltage signal to a threshold voltage value (from the threshold voltage). The determination circuitry 206 is also configured to deactivate the respective loop when the voltage signal (PTS) exceeds the threshold voltage value (from VREF). Deactivation of the loop 184 may include turning the loop off, passively decoupling the loop, and/or a hybrid combination thereof.

The inverting Schmitt trigger circuit 204 acts as a comparator circuit. The inverting Schmitt trigger circuit 204 includes an inverting operational amplifier 208 (e.g., dedicated operational amplifier for the determination circuitry 206). The voltage signal (PTS) representative of the temperature of the loop is provided as input to the inverting terminal of the inverting operation amplifier 208. Resistors (R4 and R5) of the inverting Schmitt trigger circuit 204 function as voltage divider on PTS. The threshold voltage signal (VREF) is provided as an input to the non-inverting terminal of the operational amplifier 208. The operational amplifier 208 generates a voltage output (VOUT) based on the comparison of PTS and VREF. A portion of the voltage output (VOUT) is added in series along with the PTS as an input to the inverting terminal of the operational amplifier 208. This series positive feedback creates hysteresis which is controlled by the proportion of resistances between R4 and the whole resistance (R4 and R5). When PTS exceeds VREF, VOUT begins to decrease eventually resulting in the deactivation of the loop. However, when PTS no longer exceeds VREF, VOUT increases eventually resulting in the reactivation of the loop. Utilization of the inverting Schmitt trigger circuit enables tight control (of the hysteresis curve) and, thus, the switching points for activating and deactivating the loop.

Figure 6:
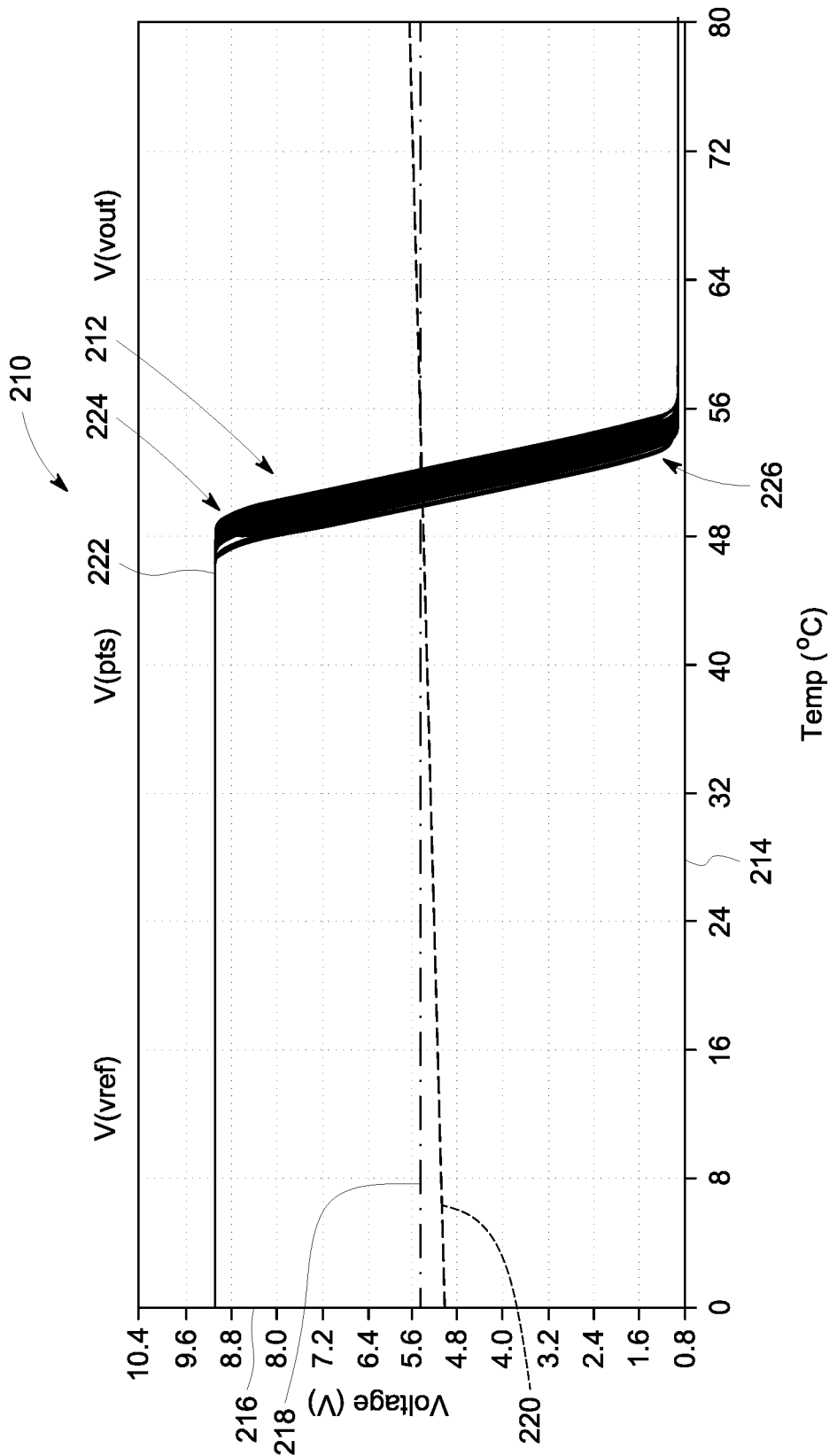
FIG. 6 is a graph illustrating control of a hysteresis curve for operation of a loop of an RF coil, in accordance with aspects of the present disclosure.

FIG. 6 is a graph 210 illustrating control of a hysteresis curve 212 for operation of a loop of an RF coil. The graph 210 includes an x-axis 214 representing temperature (e.g., measured temperature) of a loop of an RF coil and a y-axis 216 representing voltage. The temperature is derived from the electrical resistance measurement of the loop (in particular, the voltage signal (PTS)) by a non-magnetic platinum temperature sensor (e.g., non-magnetic platinum temperature sensor 202 in FIG. 4). Plot 218 represents the reference voltage (VREF) provided to an inverting Schmitt trigger circuit (e.g., inverting Schmitt trigger circuit 204 in FIG. 5) coupled to the non-magnetic platinum temperature sensor. Plot 220 represents (PTS) the voltage of representing the measured electrical resistance (and the temperature) of the loop provided to the inverting Schmitt trigger circuit. Plot 222 represents the output voltage (VOUT) of an inverting operational amplifier of the inverting Schmitt trigger.

As depicted in the graph 210, while PTS does not exceed VREF, VOUT remains constant (and at a high point). Once PTS exceeds VREF, VOUT begins to gradually decline (over a few degrees Celsius) as the difference between PTS and VREF increases until it reaches a low point. The decline in VOUT begins at a first switching point 224 (e.g., at 48 degrees Celsius, a lower threshold temperature in the example). At this first switching point 224 of the hysteresis curve, the loop may be decoupled until VOUT reaches a second switching point 226 of hysteresis curve (where the low point in VOUT is reached) and the loop may then be turned off. Conversely, if the temperature of the loop cools to below an upper threshold temperature (at the second switching point 226), the loop may be turned back on and eventually recoupled. Thus, with the utilization of the inverting Schmitt trigger, a loop of the RF coil can both be deactivated and reactivated.

Figure 7:
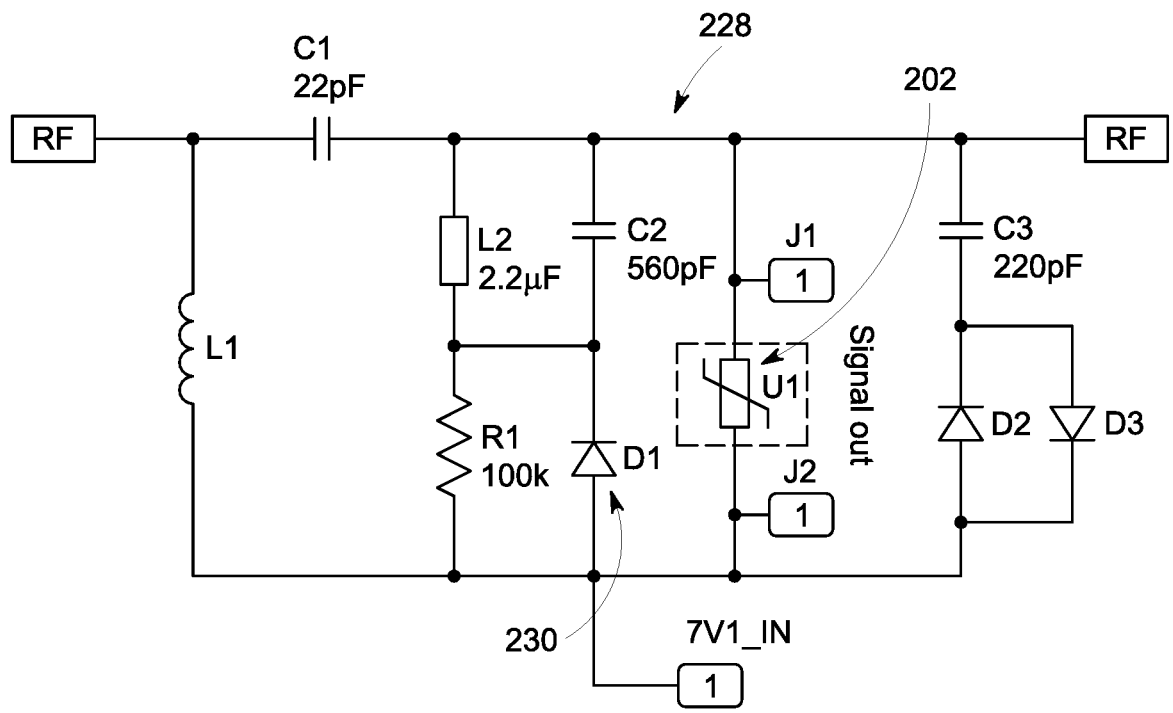
FIG. 7 is a schematic diagram of circuitry of the RF coil coupled to a non-magnetic platinum temperature sensor, in accordance with aspects of the present disclosure.
Figure 8:
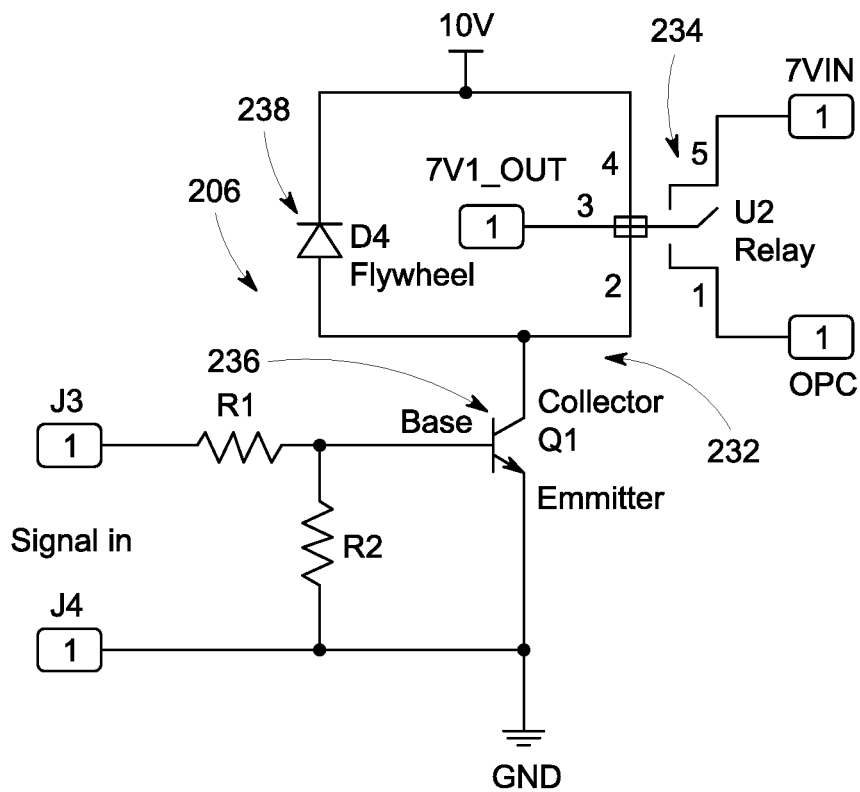
FIG. 8 is a schematic diagram of determination circuitry, in accordance with aspects of the present disclosure.

FIG. 7 is a schematic diagram of circuitry 228 (e.g., regulatory circuitry) of the RF coil coupled to the non-magnetic platinum temperature sensor 202. FIG. 8 is a schematic diagram of determination circuitry 206 coupled to the circuitry 228 (and the non-magnetic platinum temperature sensor 202). In FIG. 7, the circuitry 228 is configured to regulate the RF coil. For example, the circuitry 228 is configured to block, detune, decouple, and/or disable the RF coil. The circuitry 228 includes a pinned diode 230 (D1) that receives the power supply (e.g., DC power). The non-magnetic platinum temperature sensor 202 outputs a voltage signal representative of the measured electrical resistance (and the temperature) of the loop of the RF coil and a reference voltage signal (representative of threshold voltage) via connectors (J1 and J2) coupled to the determination circuitry 206 in FIG. 8.

In FIG. 8, the determination circuitry 206 includes an electronic switching circuit 232 having an electromechanical relay 234 coupled to a transistor 236. The transistor 236 controls the electromechanical relay 234. The determination circuitry 206 also includes a flyback diode 238 (D4). The flyback diode 238 eliminates flyback (a voltage spike across an inductive load) when the supply current is suddenly reduced. The input of the voltage signal representative of the measured electrical resistance (and the temperature) of the loop of the RF coil and the reference voltage signal (representative of threshold voltage) are received via connectors (J3 and J4). Valleys of the resistors (R1 and R2) are selected for the desired threshold voltage value for the desired threshold temperature. The resistors (R1 and R2) are set to the same temperature. The electromechanical relay 234 operates at a high speed. The transistor 236 is cut-off and acts as open circuit when there is no voltage (or negative voltage) on the base terminal until a positive voltage (greater than the threshold voltage value set by the resistors R1 and R2) is applied to the base terminal to force the transistor 236 to act as a short circuit (ON). When the transistor 236 is cut-off (i.e., acts as an open circuit), the electromechanical relay 234 is turned off and power is not supplied to pinned diode 230 in FIG. 7 (thus inactivating the loop). When the transistor 236 acts as short circuit, the electromechanical relay 234 is turned on and power is supplied to the pinned diode 230 in FIG. 7 (thus activating the loop). The inputted signals (i.e., the voltage signal representative of the temperature of the loop and the reference voltage signal) are combined or compared prior to the transistor 236. When the voltage signal representative of the temperature of the loop is less than or equal to the threshold voltage value, the positive voltage is applied to the base terminal of the transistor 236. When the voltage signal representative of the temperature of the loop exceeds the threshold voltage value, no voltage or negative voltage is applied to the base terminal of the transistor 236.

Figure 9:
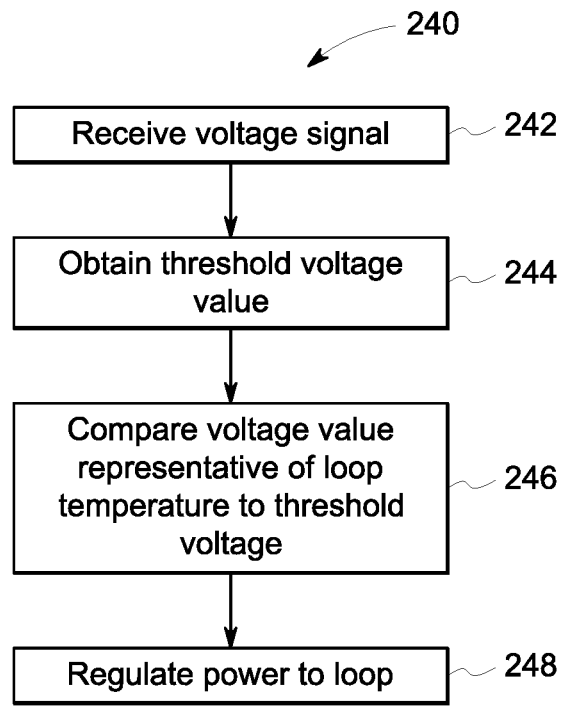
FIG. 9 is a flow chart of a method for regulating a loop of an RF coil, in accordance with aspects of the present disclosure.

FIG. 9 is a flow chart of a method 240 for regulating a loop of an RF coil. The method 240 may be performed by the circuitry described above (including the non-magnetic platinum temperature sensor 202 and the determination circuitry 206). The determination circuitry 206 may include the inverting Schmitt trigger circuit or the electronic switching circuit having an electromechanical relay coupled to a transistor. In certain embodiments, the steps of the method 240 may be performed at the same time or in a different order from that depicted in FIG. 9.

The method 240 includes receiving a voltage signal representative of the electrical resistance (and the temperature) of the respective loop from the non-magnetic platinum temperature sensor (block 242). In certain embodiments, the method 240 includes obtaining the threshold voltage value (e.g., reference value) (block 244). The threshold voltage value corresponds to the desired threshold temperature. In certain embodiments, the threshold voltage value may be provided via a voltage divider associated with resistors set to for a resistance equivalent to the desired threshold temperature. The method 240 further includes comparing the voltage signal (representative of the temperature of the loop) to the threshold voltage value representative of a threshold temperature (block 246). The method even further includes regulating power (e.g., DC power) provided to the loop (block 248). Regulating the power provided to the loop includes deactivating the respective loop when the voltage signal exceeds the threshold voltage value. Deactivation of the loop may include turning the loop off, passively decoupling the loop, and/or a hybrid combination thereof. In certain embodiments, regulating the power provided to the loop includes reactivating the respective loop when the voltage signal equals or falls below the threshold voltage value.

Figure 10:
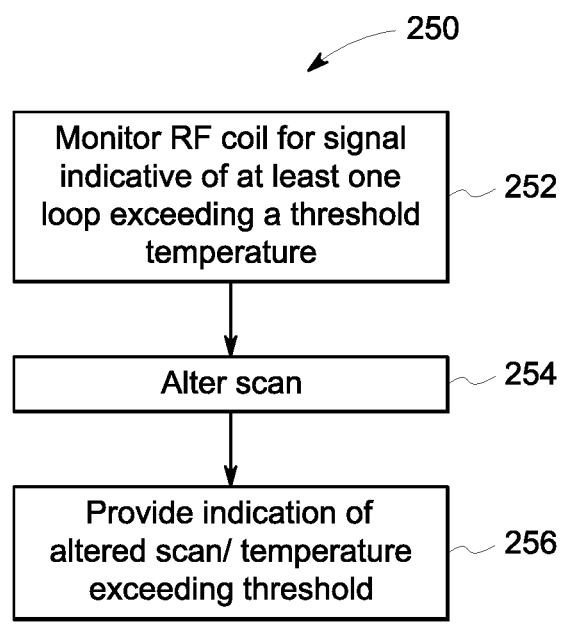
FIG. 10 is a flow chart of a method for regulating operation of a magnetic resonance imaging (MRI) system, in accordance with aspects of the present disclosure.

FIG. 10 is a flow chart of a method 250 for regulating operation of the MRI system. The method 250 may be performed by the control circuitry (e.g., of the MRI system 100 in FIG. 1) described above. In certain embodiments, the steps of the method 250 may be performed at the same time or in a different order from that depicted in FIG. 10.

The method 250 includes monitoring, during a scan by the MRI system, the RF receiving coil for a signal indicative of at least one loop of the RF receiving coil exceeding a threshold temperature (block 252). The method 250 also includes altering the scan by the MRI system upon receiving the signal indicative of at least one loop of the RF receiving coil exceeding the threshold temperature (block 254). In certain embodiments, the act of altering the scan by the MRI system includes ceasing the scan (i.e., implementing a fail-safe condition) and stopping the RF receiving coil. In certain embodiments, the act of altering the scan by the MRI system includes derating the scan (i.e., altering the scan to a lower quality scan). In certain embodiments, altering of the scan may be automatic. In certain embodiments, an operator of the MRI scan may be given the options of ceasing the scan or derating the scan, and the alteration of the scan will be determined by the option selected by the operator. In certain embodiments, the method 260 further includes providing an indication (e.g., user perceptible indication) of the temperature of at least one loop of the RF receiving coil exceeding the threshold temperature, options for altering the scan, and/or indication of the alteration of the scan (block 256).

Technical effects of the disclosed subject matter include providing active monitoring and mitigation of thermal events on MR surface coils (e.g., RF receiving coils). The disclosed embodiments provide secondary mitigation in case primary mitigation fails in response to thermal events on the MR surface coils. The disclosed embodiments further ensure patient safety.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) receiving coil assembly for a magnetic resonance imaging (MRI) system, comprising:
    a plurality of loops; and
    a plurality of electronics units, wherein each respective electronics unit of the plurality of electronics units is coupled to a respective loop of the plurality of loops, wherein each respective electronics unit comprises circuitry configured to measure a temperature of the respective loop and to regulate power provided to the respective loop based on the temperature of the respective loop.

2. A system for regulating operation of a magnetic resonance imaging (MRI) system, comprising:
    a memory encoding processor-executable routines; and
    a processor configured to access the memory and to execute the processor-executable routines, wherein the routines, when executed by the processor, cause the processor to:
        monitor, during a scan by the MRI system, a radio frequency (RF) receiving coil assembly of the MRI system for a signal indicative of at least one loop of a plurality of loops of the RF coil assembly exceeding a threshold temperature, wherein each respective loop of the plurality of loops comprises circuitry configured to measure a temperature of the respective loop and to regulate power provided to the respective loop based on the temperature of the respective loop, wherein the signal is based on a measurement of the temperature of the at least one loop by the circuitry; and
        alter the scan of the MRI system upon receiving the signal indicative of the at least one loop exceeding the threshold temperature.

3. A magnetic resonance imaging (MRI) system, comprising:
    an imaging portion having a radio frequency (RF) receiving coil, wherein the RF receiving coil comprises a plurality of loops, wherein each respective loop of the plurality of loops comprises circuitry configured to measure a temperature of the respective loop and to deactivate the respective loop when the temperature of the respective loop exceeds a threshold temperature; and
    a controller configured to monitor, during a scan by the MRI system, the RF receiving coil assembly of the MRI system for a signal indicative of at least one loop of the plurality of loops exceeding the threshold temperature and to cease the scan or to alter the scan to a lower quality scan upon receiving the signal indicative of the at least one loop exceeding the threshold temperature.

4. The RF receiving coil assembly of claim 1, wherein the circuitry is configured to deactivate the respective loop when the temperature of the respective loop exceeds a threshold temperature.

5. The system of claim 2, wherein altering the scan of the MRI system comprises ceasing the scan.

6. The system of claim 2, wherein altering the scan of the MRI system comprises altering the scan to a lower quality scan.

7. The system of claim 2, wherein the circuitry is configured to deactivate the respective loop when the temperature of the respective loop exceeds a threshold temperature.

8. The system of claim 2, wherein the circuitry comprises a non-magnetic platinum temperature sensor configured to measure an electrical resistance of the respective loop, the electrical resistance corresponding to the temperature of the respective loop.

9. The MRI system of claim 3, wherein the circuitry comprises a non-magnetic platinum temperature sensor configured to measure an electrical resistance of the respective loop, the electrical resistance corresponding to a temperature of the respective loop.

10. The RF receiving coil assembly of claim 4, wherein the circuitry is configured to provide a signal indicative of the temperature of the respective loop exceeding the threshold temperature to a controller of the MRI system.

11. The system of claim 8, wherein the circuitry comprises determination circuitry coupled to the non-magnetic platinum temperature sensor, wherein the determination circuitry is configured to receive a voltage signal representative of the electrical resistance of the respective loop from the non-magnetic platinum temperature sensor, to compare the voltage signal to a threshold voltage value representative of a threshold temperature, and to deactivate the respective loop when the voltage signal exceeds the threshold voltage value.

12. The RF receiving coil assembly of claim 10, wherein the circuitry comprises a non-magnetic platinum temperature sensor configured to measure an electrical resistance of the respective loop, the electrical resistance corresponding to the temperature of the respective loop.

13. The system of claim 11, wherein the determination circuitry comprises an inverting Schmitt trigger circuit.

14. The system of claim 13, wherein the inverting Schmitt trigger circuit is configured to reactivate the respective loop when the voltage signal is equal to or less than the threshold voltage value.

15. The system of claim 11, wherein the determination circuitry comprises an electronic switching circuit having an electromechanical relay coupled to a transistor.

16. The MRI system of claim 9, wherein the circuitry comprises determination circuitry coupled to the non-magnetic platinum temperature sensor, wherein the determination circuitry is configured to receive a voltage signal representative of the electrical resistance of the respective loop from the non-magnetic platinum temperature sensor, to compare the voltage signal to a threshold voltage value representative of the threshold temperature, and to deactivate the respective loop when the voltage signal exceeds the threshold voltage value.

17. The RF receiving coil assembly of claim 12, wherein the circuitry comprises determination circuitry coupled to the non-magnetic platinum temperature sensor, wherein the determination circuitry is configured to receive a voltage signal representative of the electrical resistance of the respective loop from the non-magnetic platinum temperature sensor, to compare the voltage signal to a threshold voltage value representative of a threshold temperature, and to deactivate the respective loop when the voltage signal exceeds the threshold voltage value.

18. The RF receiving coil assembly of claim 17, wherein the determination circuitry comprises an inverting Schmitt trigger circuit.

19. The RF receiving coil assembly of claim 17, wherein the determination circuitry comprises an electronic switching circuit having an electromechanical relay coupled to a transistor.

20. The RF receiving coil assembly of claim 18, wherein the inverting Schmitt trigger circuit is configured to reactivate the respective loop when the voltage signal is equal to or less than the threshold voltage value.

* * * * *